US010388365B2

(12) United States Patent
Zhang et al.

(10) Patent No.: US 10,388,365 B2
(45) Date of Patent: Aug. 20, 2019

(54) WRITE ASSIST CIRCUIT FOR LOWERING A MEMORY SUPPLY VOLTAGE AND COUPLING A MEMORY BIT LINE

(71) Applicant: Avago Technologies International Sales Pte. Limited, Singapore (SG)

(72) Inventors: Yifei Zhang, Edina, MN (US); Mark J. Winter, Seattle, WA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/940,800

(22) Filed: Mar. 29, 2018

(65) Prior Publication Data

US 2018/0218769 A1 Aug. 2, 2018

Related U.S. Application Data

(63) Continuation of application No. 15/135,133, filed on Apr. 21, 2016, now Pat. No. 9,940,994.

(60) Provisional application No. 62/320,346, filed on Apr. 8, 2016.

(51) Int. Cl.
*G11C 11/00* (2006.01)
*G11C 11/419* (2006.01)
*G11C 5/14* (2006.01)
*G11C 11/412* (2006.01)

(52) U.S. Cl.
CPC ............. *G11C 11/419* (2013.01); *G11C 5/14* (2013.01); *G11C 11/412* (2013.01)

(58) Field of Classification Search
CPC ..... G11C 11/413; G11C 11/412; G11C 11/419; G11C 11/41
See application file for complete search history.

(56) References Cited

U.S. PATENT DOCUMENTS

| 9,123,439 B2* | 9/2015 | Pilo ..................... G11C 11/419 |
| 9,355,710 B2* | 5/2016 | Gong .................... G11C 5/147 |
| 2015/0146479 A1 | 5/2015 | Pilo |
| 2015/0206577 A1 | 7/2015 | Gong et al. |

OTHER PUBLICATIONS

U.S. Office Action for U.S. Appl. No. 15/135,133 dated Sep. 15, 2017.
US Notice of Allowance for U.S. Appl. No. 15/135,133 dated Dec. 6, 2017.
US Office Action for U.S. Appl. No. 15/135,133 dated Mar. 3, 2017.

* cited by examiner

*Primary Examiner* — Gene N Auduong
(74) *Attorney, Agent, or Firm* — Foley & Lardner LLP

(57) ABSTRACT

A circuit and method performs a write assist for a memory cell (e.g., a static random access memory cell (SRAM)). The method includes providing a lower supply voltage signal to a voltage supply node of the memory cell using a capacitor. The lower supply voltage signal is lower in voltage level than a supply voltage signal. The method further includes lowering a common signal provided to a write driver using the capacitor.

20 Claims, 5 Drawing Sheets

WRITE ASSIST CIRCUIT FOR LOWERING A MEMORY SUPPLY VOLTAGE AND COUPLING A MEMORY BIT LINE

CROSS-REFERENCE TO RELATED APPLICATIONS

This application is a continuation of and claims priority to and the benefit of U.S. patent application Ser. No. 15/135,133, filed Apr. 21, 2016, which claims the benefit of and priority to U.S. Provisional Application No. 62/320,346, filed Apr. 8, 2016, the contents of which are hereby incorporated herein by reference in their entirety for all purposes.

BACKGROUND OF THE DISCLOSURE

In the last few decades, the market for wireless communication, sensing, storage and computing devices has grown by orders of magnitude, fueled by the use of portable devices, and increased connectivity and data transfer between all manners of devices. Furthermore, integrated circuit (IC) fabrication improvements, as well as advances in circuit integration and other aspects have made electronic equipment smaller, cheaper, and more reliable. ICs include memory cells, such as, static random access memory (SRAM) cells. SRAM cells employ write assist schemes to address write margin issues in operating voltage ranges for SRAM cells.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
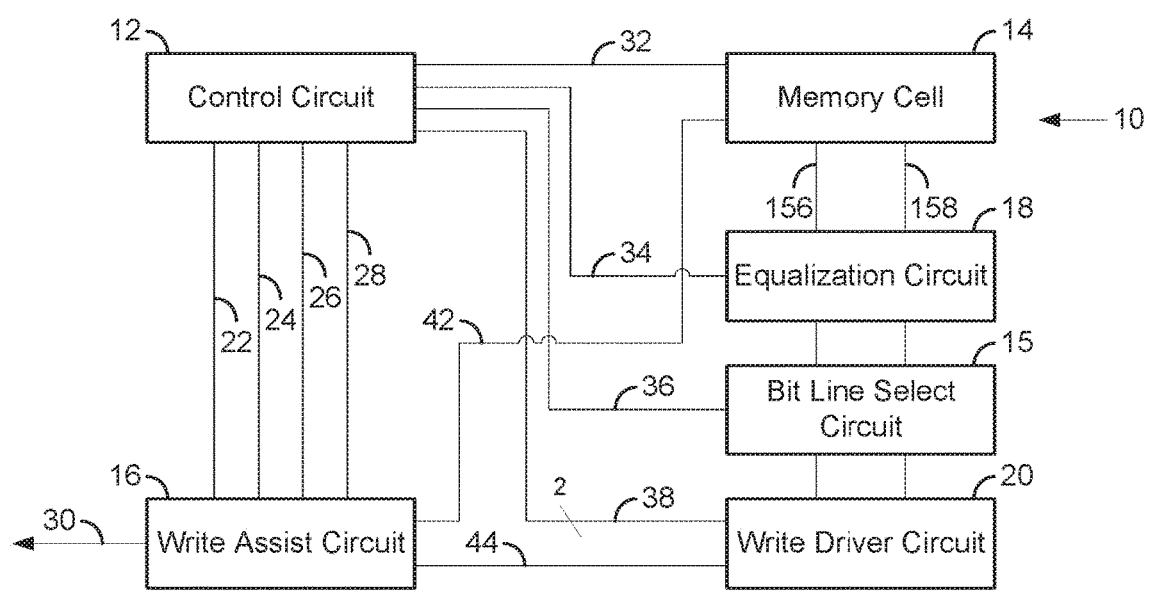
FIG. 1 is a schematic general block diagram of a storage circuit including a control circuit, a write assist circuit, an equalization circuit, a bit line select circuit, a write driver circuit, and a memory cell in accordance with some embodiments.

Described herein with reference to FIGS. 1-5 are systems for and methods of providing a write assist operation for a memory or storage device according to some embodiments. Such systems and methods can be used in virtually any application that uses or benefits from a write assist operation. In some embodiments, a write assist architecture provides a drain supply voltage (Vdd) lowering circuit combined with a negative bit line boost/supply circuit while using less IC area and power than a combination of a separate conventional drain supply lowering circuit and a separate conventional negative bit line boost/supply circuit. The write assist architecture includes a circuit including four switches and a capacitor configured to lower the memory supply voltage (VMEM) and to couple (e.g., consequently) a memory bit line to a voltage level below ground in some embodiments. In some embodiments, the charge collected by the capacitor during the lowering of the memory supply voltage is used for coupling the memory bit line to a voltage level below ground and thus reduces the power consumed during write margin improvement. The capacitor can be made using a regular transistor structure for area reduction in some embodiments.

In some embodiments, the write assist circuit reduces integrated circuit (IC) area and power consumed by using a smaller assist capacitor (e.g., a 5-10% smaller than an input/output (I/O) peripheral capacitor). The write assist circuit is also configured to reduce device stress by using a less negative bit line (the voltage drop from the gate to source (VGS) minus the drain voltage on the pass gate transistor of the memory cell is 30-40% less than the voltage drop used in a conventional negative bit line assist scheme) in some embodiments. In some embodiments, the write assist circuit avoids performance degradation as compared with conventional negative bit line assist techniques because Vdd lowering is implemented in concurrence with the bit line discharge. The write assist circuit enables lower system power by allowing the storage device to operate at lower voltage and enables higher system performance in some embodiments. The write assist circuit reduces package and cooling costs associated with the memory or storage device in some embodiments.

In some embodiments, a static random access memory (SRAM) integrated circuit includes a static random access memory cell having a voltage supply node and a bit line and a write assist circuit. The write assist circuit is configured to use charge stored in a capacitor to both provide a lower supply voltage level at the voltage supply node and drive the bit line to a level below ground.

In some embodiments, a write assist circuit includes a capacitor and a transistor circuit. The transistor circuit is configured to couple the capacitor to a memory cell supply voltage node to lower a supply voltage at the memory cell supply voltage node and to couple the capacitor to a write driver to drive a bit line to a voltage level below ground.

In some embodiments, a method performs a write assist for a static random access memory cell. The method includes providing a lower supply voltage signal to a voltage supply node of the static random access memory cell using a capacitor. The lower supply voltage signal is lower in voltage than a supply voltage signal. The method further includes lowering a common signal provided to a write driver using the capacitor.

With reference to FIG. 1, a storage system 10 includes a control circuit 12, a memory cell 14, a bit line select circuit 15, a write assist circuit 16, an equalization circuit 18, and a write driver circuit 20. The storage system 10 can be any type of electronic system or device including a communication, computing, sensing, or other device that includes the memory cell 14. In some embodiments, the memory cell 14 is a static random access memory (SRAM) cell and the storage system 10 is an SRAM system. In some embodiments, the storage system 10 is part of or associated with an IC having core circuitry, such as, one or more central processing unit (CPU) cores. In some embodiments, the storage system 10 is a cache memory.

The control circuit 12 provides control and power signals to the memory cell 14, the bit line select circuit 15, the write assist circuit 16, the equalization circuit 18, and the write driver circuit 20. In some embodiments, the control circuit 12 provides timing and selection signals that enable writing of a logic high (e.g., approximately Vdd) or low (e.g., approximately 0 Volts (V)) to the memory cell 14. The control circuit 12 is a processor or logic circuit configured to provide signals as described herein in some embodiments.

In some embodiments, the control circuit 12 provides a power supply write signal on a conductor 22 to cause the write assist circuit 16 to provide a power supply signal (V1) to the conductor 42 which is coupled to a supply node (e.g., VMEM) of the memory cell 14. The control circuit 12 provides a capacitor supply signal on a conductor 24 to cause the write assist circuit 16 to provide a lower voltage power supply signal (V2) to the conductor 42 in some embodiments. The control circuit 12 removes the capacitor supply signal on the conductor 24, provides a boost change signal on a conductor 26, and removes a boost control signal on a conductor 28 to cause the write assist circuit 16 to provide a lower ground or common signal to a conductor 44 which is coupled to the write driver circuit 20 in some embodiments. The lower ground or common signal is provided to one of bit lines 156 and 158 via the write driver circuit 20 and the bit line select circuit 15. The control circuit 12 provides true and false write bit signals on conductors 38 to cause the write driver circuit 20 to write a logic high or low to the memory cell 14. The control circuit 12 provides a bit line select signal on a conductor 36 to the bit line select circuit 15 to select the bit lines 156 and 158 for a read and/or write operation and an equalization signal on a conductor 34 of the equalization circuit 18 to pre-charge and equalize the bit lines 156 and 158 for a write and/or read operation. The control circuit 12 provides a word line signal on a conductor 32 to select the memory cell 14 for a write and/or read operation.

In some embodiments, the write assist circuit 16 advantageously provides Vdd lowering and negative bit line boost operations. In some embodiments, the write assist circuit 16 is a transistor/capacitor circuit configured to provide both Vdd lowering and negative bit line boost operations. The write assist circuit 16 provides the power supply signal (Vdd, e.g., 5.0, 3.3, 1.3, 1.0 volts direct current (VDC)) at a supply node 30 to the conductor 42 of the memory cell 14 and provides a lower voltage signal (e.g., 10 percent less, 2 MOSFET voltage drops, 0.3-0.6 VDC less, etc.) at the conductor 42 to achieve Vdd lowering during a write operation in some embodiments. The write assist circuit 16 also performs a negative bit line boost by lowering one of the bit lines 156 or 158 to a level below a ground level for a period of time during the write operation in some embodiments. The bit line 156 or 158 can be lowered by less than 10 percent of Vdd below ground using the write driver circuit 20 in some embodiments. The voltage levels and drops discussed above are exemplary only; other voltage levels and drops can be utilized.

In some embodiments, the memory cell 14 is a six transistor SRAM cell for storing a logic one or zero in response to a write operation controlled by the control circuit 12. The memory cell 14 can be one of many cells in a matrix of cells. In some embodiments, a matrix of cells is arranged in rows selected via word lines (e.g., conductor 32) and columns selected via the bit lines 156 and 158.

In some embodiments, the equalization circuit 18 is a transistor circuit for pre-charging and equalizing the bit lines 156 and 158. In some embodiments, the bit line select circuit 15 is a transistor circuit for connecting the bit lines 156 and 158 to the write driver circuit 20. The write driver circuit 20 is a transistor circuit for driving logic ones or zeros on the bit lines 156 and 158 for storage in the memory cell 14 in some embodiments.

Figure 2:
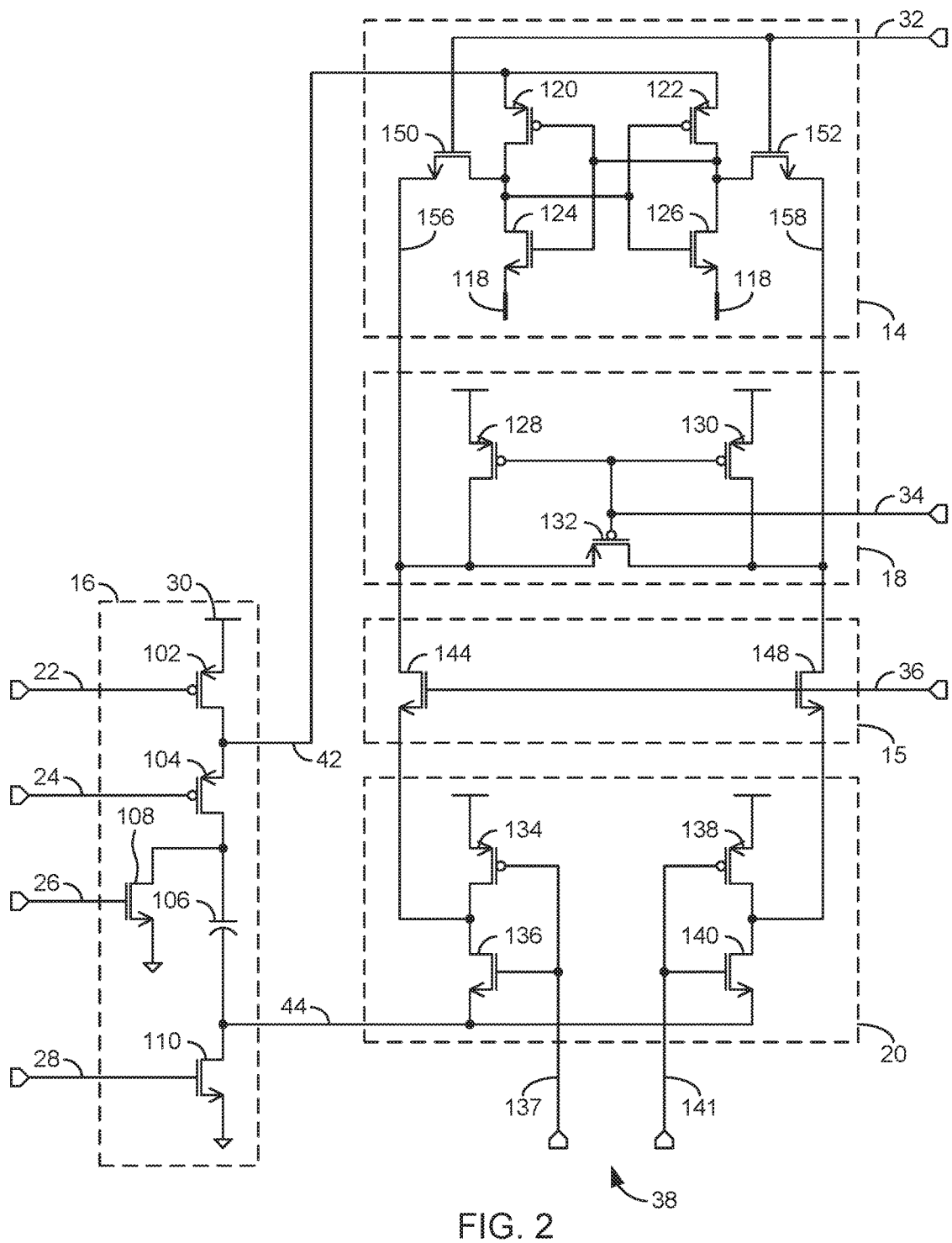
FIG. 2 is an electrical schematic diagram of the write assist circuit, the equalization circuit, the write driver circuit, the bit line select circuit and the memory cell illustrated in FIG. 1 in accordance with some embodiments.

With reference to FIG. 2, the memory cell 14 includes a pull up transistor 120, a pull up transistor 122, a pull down transistor 124, a pull down transistor 126, a pass gate transistor 150, and a pass gate transistor 152. The pull up transistors 120 and 122 are P-channel metal oxide field effect transistors (MOSFETs), and the pull down transistors 124 and 126 are N-channel MOSFETs in some embodiments. The pass gate transistors 150 and 152 are N-channel MOSFETs in some embodiments. The memory cell 14 is a six transistor SRAM cell coupled between the bit lines 156 and 158 in some embodiments. The pair of transistors 120 and 124 and the pair of transistors 122 and 126 are each are in series between the conductor 42 (e.g., node VMEM) and a node 118 (e.g., Vss).

The equalization circuit 18 includes a pre-charge transistor 128, a pre-charge transistor 130 and an equalization transistor 132. The transistors 128, 130, and 132 are P-channel MOSFETs in some embodiments. A logic high pre-charge or equalization signal on the conductor 34 pre-charges the bit lines 156 and 158 via the transistors 128 and 130 and equalizes the bit lines 156 and 158 via the transistor 132.

The bit line select circuit 15 includes a transistor 144 and a transistor 148. The transistors 144 and 148 are N-channel MOSFETs in some embodiments. A logic high bit line select signal is provided on the conductor 36 to connect the bit lines 156 and 158 to the write driver circuit 20 via the transistors 144 and 148, respectively.

The write assist circuit 16 includes a transistor 102, a transistor 104, a capacitor 106, a transistor 108, and a transistor 110. The transistors 102 and 104 are P-channel MOSFETs, and the transistors 108, and 110 are N-channel MOSFETs in some embodiments. The capacitor 106 is provided in the IC area associated with a core transistor in some embodiments.

Before a write operation, the transistors 102, 108, and 110 are turned on, and the transistor 104 is turned off. During the write operation, the write driver circuit 20 drives a logic high on one of bit lines 156 or 158 and a logic low on the other of bit lines 156 or 158. The transistor 102 responds to the power supply write signal being a logic low at the conductor 22 and provides the voltage at the supply node 30 (minus the voltage drop of the transistor 102) to the conductor 42. During the write operation, the transistor 102 is turned off in response to the power supply write signal being a logic high, the transistor 104 is turned on in response to the capacitor power supply signal being a logic low at the conductor 24 and the transistor 108 is turned off in response to the boost change signal being a logic low. The voltage at the conductor 42 is provided to the capacitor 106 which is charged via a path through the transistors 104 and 110 to a ground node 114. The capacitor 106 is fully charged and stops charging when the transistor 110 is turned off. The voltage at the node between the capacitor 106 and the transistor 104 (e.g., the conductor 42) is below the voltage Vdd (e.g., Vdd minus the voltage drop associated with the transistors 102 and 104) during the Vdd lowering operation.

During the write operation, after the transistor 102 is turned off (by providing a logic high power supply write signal); the voltage associated with the capacitor 106 is provided to conductor 42 through the transistor 104 to effect Vdd lowering. The voltage at the conductor 44 is the voltage at the node between the capacitor 106 and the transistor 104 minus the voltage drop associated with the transistor 104 during Vdd lowering. Lowering the voltage at the conductor 44 weakens the pull up transistors 120 and 122 in some embodiments. During bit line lowering, the transistor 102 is turned on and returns the conductor 42 to a voltage level at or near Vdd (e.g., the voltage at supply node 30 minus the drop of the transistor 102 when on) in some embodiments.

To effect bit line lowering, the transistor 110 remains off (by providing a logic low boost control signal), transistor 108 is turned on (by providing a logic high boost change signal), and the transistor 104 is turned off by providing a logic high capacitor supply signal. When the transistor 108 is turned on, the voltage at the node between the transistor 104 and capacitor 106 becomes approximately ground and the voltage at the conductor 44 becomes below ground. The voltage below ground is applied to one of bit lines 56 or 58 of the memory cell 14 via the write driver circuit 20. Near the end of the time period for bit line lowering, the transistor 102 is turned on followed by turning on the transistor 110 and the transistor 104 remains off. The negative voltage at the conductor 44 strengthens pass gate transistors 150 and 152 of the memory cell 14 in some embodiments.

The write driver circuit 20 includes a transistor 134, a transistor 138, a transistor 136, and a transistor 140. The transistors 134 and 138 are P-channel MOSFETs and the transistors 136 and 140 are N-channel MOSFETs in some embodiments. A logic high or low is provided on a conductor 137 associated with conductors 38 to write the logic high or low to the memory cell 14 via the bit line 156. The opposite of the logic high or low on the conductor 137 is provided on the conductor 141 to write the logic high or low to the memory cell 14 via the bit line 158. The logic low is driven at a level below ground due to the negative bit line boost operation provided via the conductor 44 in some embodiments. When a logic high is provided on the conductor 137 and a logic low is provided on the conductor 141, a logic low is driven on the bit line 156 and a logic high is driven on the bit line 158. When a logic high is provided on the conductor 141 and a logic low is provided on the conductor 137, a logic low is driven on the bit line 158 and a logic high is driven on the bit line 156.

Figure 3:
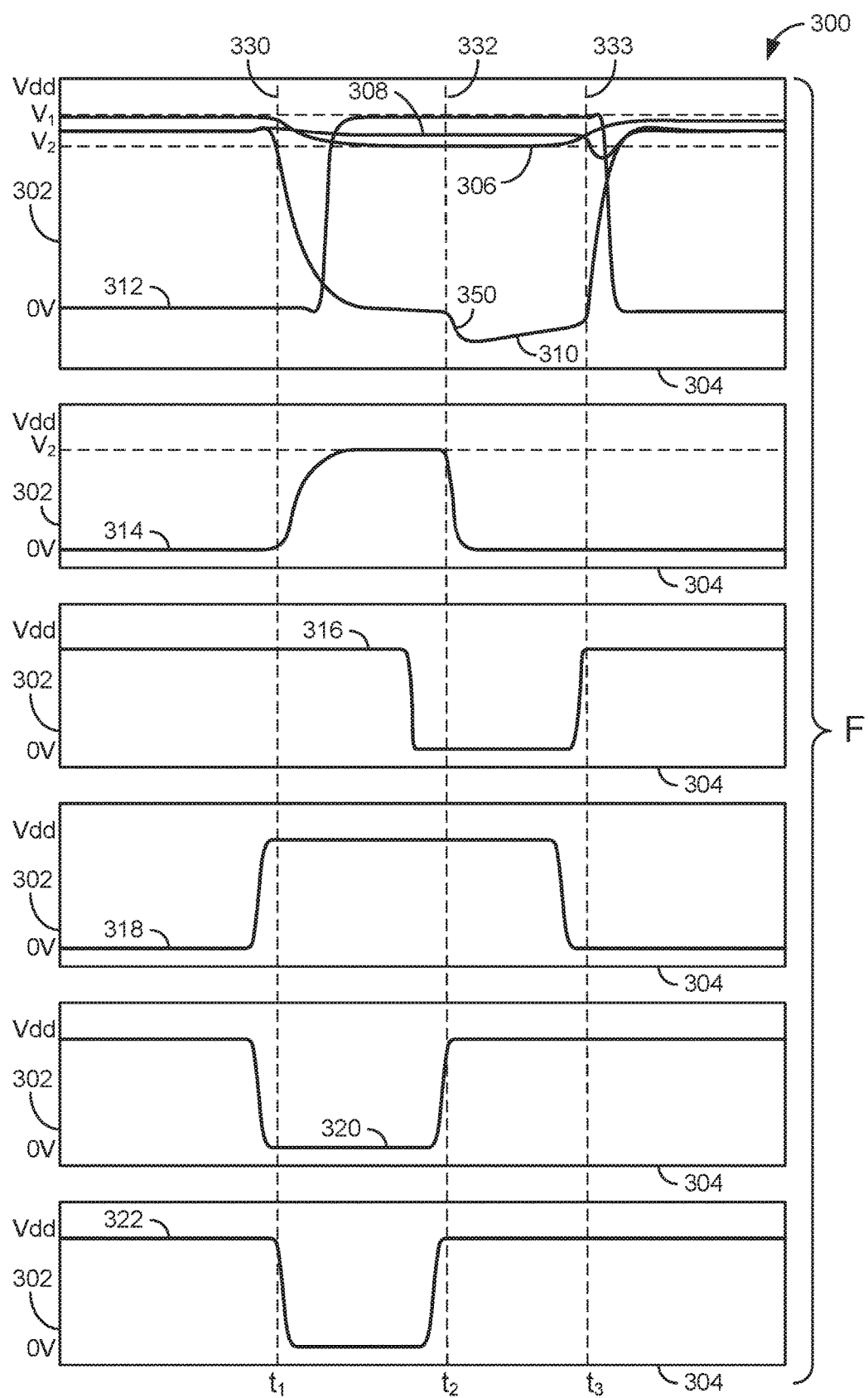
FIG. 3 is a waveform diagram of signals associated with the storage circuit illustrated in FIG. 1 in accordance with some embodiments.

With reference to FIG. 3, a timing diagram 300 includes an X axis 302 representing time and a Y axis 304 representing voltage level with levels Vdd, V1 and V2, and 0 V marked on the Y axis 304. A line 306 represents the signal on the conductor 42 (VMEM). The line 306 is at a level V1 (e.g., slightly less than Vdd) until time t1 and is decreased to a level V2 which is less than V1 between a time t1 and time t3 in accordance with the Vdd lowering operation. The level V2 is less than level V1 by a magnitude associated with the drop across the transistor 104 (FIG. 2) when the transistor 104 is turned on.

The write bit false signal is represented by a line 306 and is provided on the bit line 156 by the write driver circuit 20 via the bit line select circuit 15 in some embodiments. The write bit true signal is represented by a line 310 and is provided on the bit line 158 by the write driver circuit 20 via the bit line select circuit 15 in some embodiments. The write bit true signal has a voltage level below ground at a point 350 in accordance with the bit line boost operation in some embodiments. In some operations, the write bit false signal is provided to the bit line 156 and the write bit false signal is provided on the bit line 158. A line 312 represents the word line signal provided on the conductor 32 and provides access to the memory cell 14 via the transistors 150 and 152 when at a logic high in some embodiments.

A line 314 represents the voltage level at the node between the capacitor 106 and the transistor 104 in some embodiments. The capacitor 106 is charged when the capacitor supply signal at the conductor 24 represented by a line 322 is a logic low. The node between the transistor 104 and the capacitor 106 is brought to ground when the boost change signal (represented by a line 320) at the conductor 26 is a logic high in some embodiments. A line 316 represents the boost control signal provided on the conductor 28 and controls the transistor 110. A line 318 represents the power supply write signal provided on the conductor 22 to control the transistor 102.

The transistors 102, 104, 108 and 110 are controlled to provide the VMEM signal represented by the line 306 on the conductor 42 and to provide the bit line true signal represented by the line 310 with the point 350 below 0 V in some embodiments. The transistors 102, 104, 108, and 110 are controlled to employ the capacitor 106 during Vdd lowering and negative bit line boost operations. The Vdd lowering operation occurs between times t1 and t2 in some embodiments. The negative bit line boost operation occurs between times t2 and t3 in some embodiments. The time periods associated with t1, t2, and t3 are dependent upon circuit components and application criteria, such, as, the capacitance of the capacitor 106, write cycle timing considerations, the response times of transistors 102, 104, 108, and 110 and the memory cell 14, the voltage levels Vdd, V1 and V2, and other system parameters in some embodiments.

Figure 4:
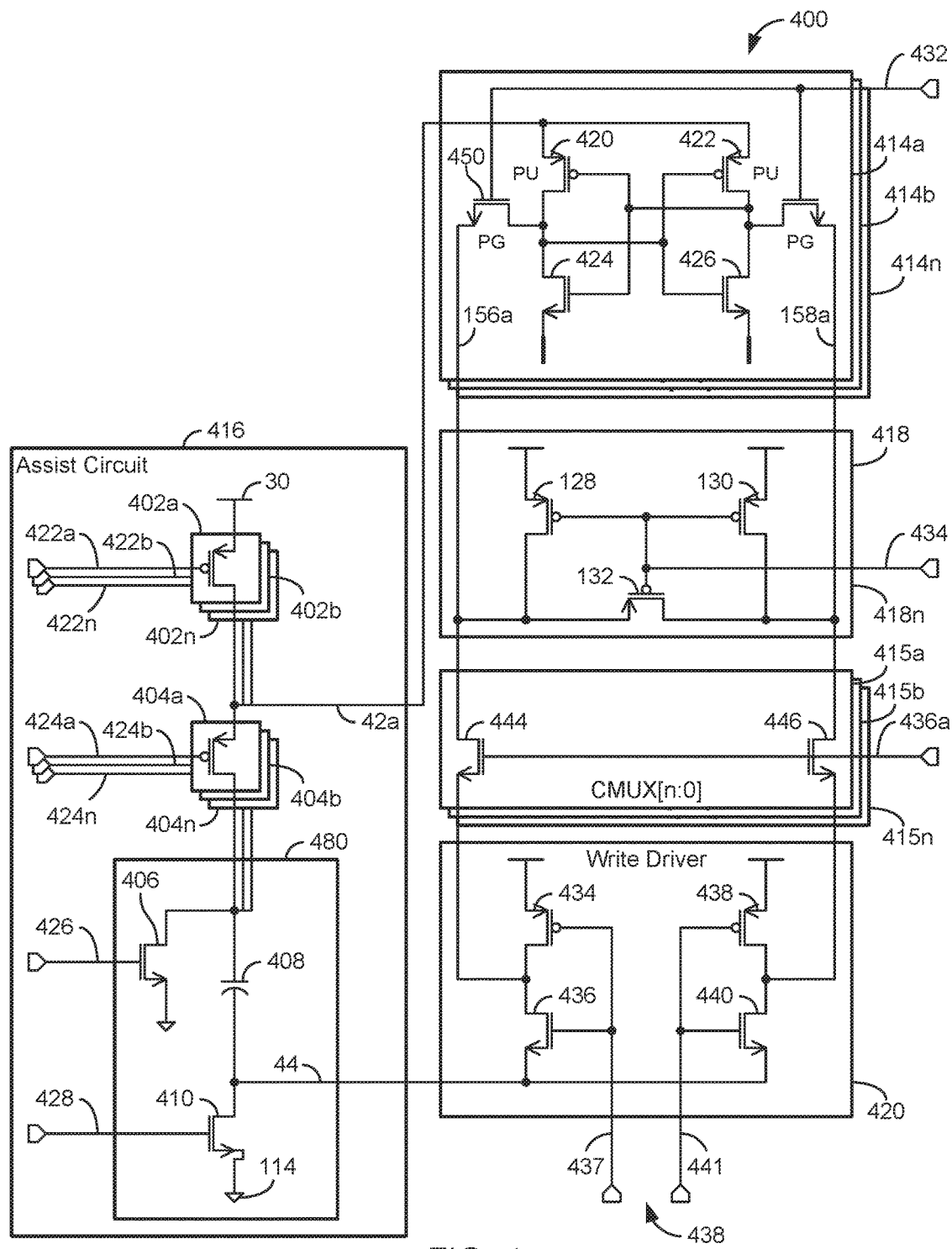
FIG. 4 is a is an electrical schematic diagram of a partially shared write assist circuit, an equalization circuit, a write driver circuit, a set of bit line select circuits and a set of memory cells in accordance with some embodiments.
Figure 5:
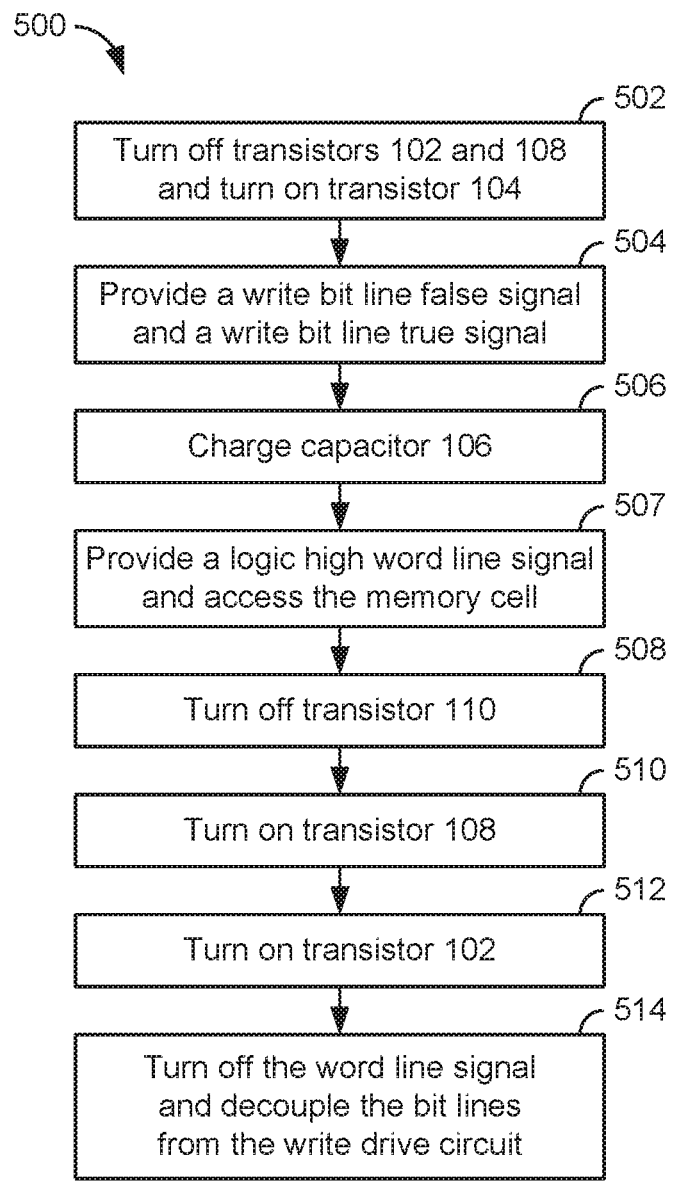
FIG. 5 is a flow diagram showing operation of the storage circuit illustrated in FIG. 1 in accordance with some embodiments.

With reference to FIG. 4, a storage system 400 is similar to storage system 100. The 400 series numbers in FIG. 4 represent like components with 100 series numbers in FIG. 2. The storage system 400 includes memory cells 414a, 414b, . . . 414n where n is any integer arranged in columns. An equalization circuit 418 is coupled to each of the memory cells 414a-n, respectively. Respective bit line select circuits 415a-n are coupled to memory cells 414a-n. The bit line select circuits 415a-n connect one of the memory cells 414a-n to a write driver circuit 420 and the equalization circuit 418 in response to bit selection signals a, b, . . . n, respectively. For example, bit lines 156a and 158a of the memory cell 414a are coupled to the equalization circuit 418 and the bit line select circuit 415a. The bit line select circuit 415a couples the bit lines 156a and 158a to the write driver circuit 420

In some embodiments, the write assist circuit 416 includes a Vdd lowering circuit 473 including transistors 402a, 402b, . . . 402n associated with the memory cells 414a, 414b, . . . 414n, respectively, and transistor 404a, 404b, . . . 404n associated with the memory cells 414a, 414b, . . . 414n, respectively. The transistors 402a, 402b, . . . 402n and the transistors 404a, 404b, . . . 404n are controlled by power supply write signals on conductors 422a, 422b, . . . 422n and capacitor supply signals on conductors 422a, 422b, . . . 422n, respectively. A shared circuit 480 for bit line boost operations includes a transistor 408, a capacitor 406 and a transistor 410. The capacitor 406 is coupled to each of the transistors 404a, 404b, . . . 404n. The shared circuit 480 services the memory cells 414a, 414b, . . . , 414n while each of the transistors 402a-n and 404a-n of the Vdd lowering circuit 473 are not shared among multiple memory cells 414a, 414b, . . . , 414n in some embodiments. The write driver circuit 420 and the equalization circuit 418 service multiple memory cells 414a, 414b, . . . 414n in some embodiments.

Referring to FIGS. 1-5, an exemplary flow 500 is used by the write assist circuit 16 to provide the Vdd lowering operation and the negative bit line boost for the memory cell 14. The flow 500 is utilized by the write assist circuit 416 (FIG. 4) which operates similar to the write assist circuit 16 where a memory cell 414a, 414b, . . . 414n is selected and respective conductors 42a, 42b, . . . 42n are powered via respective transistors 402a, 402b, . . . 402n and transistors 404a, 404b, . . . 404n in some embodiments.

At an operation 502, the transistors 102 and 108 are turned off and the transistor 104 is turned on as Vdd lowering begins. The transistor 110 remains in an on state. At an operation 504, a write bit line false signal is provided on one of conductors 137 and 141 and a write bit line true signal is provided on the other of conductors 137 and 141. At an operation 506, the capacitor 106 begins charging to a voltage level V2 and the voltage associated with the capacitor 106 is used for Vdd lowering. At an operation 507, a logic high word line signal is provided to the conductor 32 and access to the memory cell 14 via the bit lines 156 and 158 is achieved. The bit lines 156 and 158 are also be coupled to the write driver circuit 20 via the bit line select signal on the conductor 36 in some embodiments.

At an operation 508, the transistors 110 is turned off before the negative bit line boost operation begins. At an operation 510, the transistor 108 is turned on and the transistor 104 is turned off as the bit line boost operation begins. When the transistor 108 is turned on, a voltage below ground is applied to the conductor 44. The capacitor 106 is discharged when the transistor 108 is turned on. At an operation 512, the transistor 102 is turned on and the conductor 42 is coupled to the supply node 30 via the transistor 102. At an operation 514, the transistor 110 is turned on which returns the conductor 44 to approximately 0 V. At an operation 514, the word line signal is turned off and the bit lines 156 and 158 can be decoupled from the write driver circuit 20.

It should be noted that certain passages of this disclosure use subscripts in connection with devices and signals for purposes of identifying or differentiating one from another or from others. These subscripts are not intended to relate entities temporally or according to a sequence, although in some cases, these entities can include such a relationship. Nor do these terms limit the number of possible entities (e.g., devices) that can operate within a system or environment.

It should be understood that the systems described above can provide multiple ones of any or each of those components and these components can be provided on either an integrated circuit or, in some embodiments, on multiple circuits, circuit boards or discrete components. In addition, the systems and methods described above can be adjusted for various system parameters and design criteria, such as output voltage level, power requirements, power supply levels, etc. Although shown in the drawings with certain components directly coupled to each other, direct coupling is not shown in a limiting fashion and is exemplarily shown. Alternative embodiments include circuits with indirect coupling between the components shown. Alternative embodiments can drive certain components with signals that are buffered, amplified, inverted, etc. with respect to the signals described herein.

While the foregoing written description of the methods and systems enables one of ordinary skill to make and use what is considered presently to be the best-mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. An integrated circuit, comprising:
a capacitor;
a transistor circuit configured to couple the capacitor to both a memory cell supply voltage node to lower a supply voltage at the memory cell supply voltage node and a write driver to drive a bit line to a level below ground; and
a control circuit coupled to the transistor circuit and configured to provide a power supply write signal and a capacitor supply signal,
wherein the transistor circuit comprises a first transistor configured to couple the memory cell supply voltage node to a supply voltage in response to the power supply write signal provided by the control circuit, and a second transistor configured to couple the memory cell supply voltage node to a lower supply voltage in response to the capacitor supply signal provided by the control circuit, the lower supply voltage being lower in voltage than the supply voltage.

2. The integrated circuit of claim 1,
wherein the first transistor is coupled in series to the second transistor, and a first end of the capacitor is coupled to the second transistor.

3. The integrated circuit of claim 1,
wherein the control circuit is further configured to provide a boost control signal; and
wherein the transistor circuit further comprises a third transistor configured to couple a first end of the capacitor to the ground in response to the boost control signal provided by the control circuit.

4. The integrated circuit of claim 3,
wherein the control circuit is further configured to provide a boost change signal; and
wherein the transistor circuit further comprises a fourth transistor configured to couple a second end of the capacitor to the ground in response to the boost change signal provided by the control circuit.

5. The integrated circuit of claim 1, wherein the capacitor is an assist capacitor and is provided in an area associated with a transistor area for a static random access memory cell, and wherein the memory cell is a static random access memory cell.

6. The integrated circuit of claim 1, wherein the capacitor has a smaller area than an I/O capacitor.

7. A write assist circuit comprising:
a capacitor; and
a transistor circuit configured to couple the capacitor to both a memory cell supply voltage node to lower a supply voltage at the memory cell supply voltage node and a write driver to drive a bit line to a level below ground;
wherein the transistor circuit comprises a first transistor, a second transistor, and a third transistor,
wherein the first transistor is coupled in series to the second transistor, and a first end of the capacitor is coupled to the second transistor, and
wherein the third transistor is coupled between the first end of the capacitor and the ground.

8. The write assist circuit of claim 7, wherein the transistor circuit further comprises a fourth transistor, and wherein the fourth transistor is coupled between a second end of the capacitor and the ground.

9. The write assist circuit of claim 7, wherein the capacitor is an assist capacitor and is provided in an area associated with a transistor area for a static random access memory cell, and wherein the memory cell is a static random access memory cell.

10. The write assist circuit of claim 7, wherein the capacitor has a smaller area than an I/O capacitor.

11. A storage system, comprising:
a memory cell having a voltage supply node and a bit line;
a write assist circuit configured to use charge stored in a capacitor to both provide a lower supply voltage level at the voltage supply node and drive the bit line to a voltage level below ground; and
a write driver configured to receive the voltage level below ground from the write assist circuit,
wherein the capacitor of the write assist circuit is coupled between the ground and the write driver when the bit line is driven to the voltage level below ground.

12. The storage system of claim 11, wherein the charge used to provide the lower supply voltage level is used to lower a common signal provided to the write driver.

13. The storage system of claim 11, wherein the lowering the common signal uses a first transistor in parallel with the capacitor and a second transistor in series with the capacitor.

14. The storage system of claim 11, further comprising:
a control circuit configured to provide a power supply write signal, a capacitor supply signal, a boost control signal, and a boost change signal.

15. The storage system of claim 11, wherein the write assist circuit comprises a first transistor configured to couple the voltage supply node to a supply voltage in response a power supply write signal, a second transistor configured to couple the voltage supply node to a lower supply voltage in response to a capacitor supply signal.

16. The storage system of claim 11, wherein the write assist circuit comprises a first transistor configured to couple a first end of the capacitor to the ground in response to a boost control signal, and a second transistor configured to couple a second end of the capacitor to the ground in response to a boost change signal.

17. The storage system of claim 11, wherein the capacitor is coupled between voltage supply node and the ground when the lower supply voltage level is provided at the voltage supply node.

18. The storage system of claim 11, wherein the memory cell is a static random access memory cell.

19. The storage system of claim 11, wherein the capacitor is an assist capacitor and is provided in an area associated with a transistor area for a static random access memory cell.

20. The storage system of claim 11, wherein the capacitor is used with a plurality of static random memory access cells.

* * * * *